(12) United States Patent
Burnley

(10) Patent No.: US 7,254,794 B1
(45) Date of Patent: Aug. 7, 2007

(54) TIMING PERFORMANCE ANALYSIS

(75) Inventor: Richard P. Burnley, Mountain View, CA (US)

(73) Assignee: Xilinx, Inc., San Jose, CA (US)

(*) Notice: Subject to any disclaimer, the term of this patent is extended or adjusted under 35 U.S.C. 154(b) by 277 days.

(21) Appl. No.: 11/144,523

(22) Filed: Jun. 3, 2005

Related U.S. Application Data

(62) Division of application No. 10/084,515, filed on Feb. 27, 2002, now Pat. No. 6,934,922.

(51) Int. Cl.
*G06F 17/50* (2006.01)

(52) U.S. Cl. .............................. 716/6; 716/11; 703/19

(58) Field of Classification Search ................... None
See application file for complete search history.

(56) References Cited

U.S. PATENT DOCUMENTS

| | | |
|---|---|---|
| 4,758,985 A | 7/1988 | Carter |
| 4,855,669 A | 8/1989 | Mahoney |
| 5,072,418 A | 12/1991 | Boutaud et al. |
| 5,142,625 A | 8/1992 | Nakai |
| RE34,363 E | 8/1993 | Freeman |
| 5,274,570 A | 12/1993 | Izumi et al. |
| 5,311,114 A | 5/1994 | Sambamurthy et al. |
| 5,339,262 A | 8/1994 | Rostoker et al. |
| 5,347,181 A | 9/1994 | Ashby et al. |
| 5,361,373 A | 11/1994 | Gilson |
| 5,381,524 A * | 1/1995 | Lewis et al. ................. 715/804 |
| 5,457,410 A | 10/1995 | Ting |
| 5,473,267 A | 12/1995 | Stansfield |
| 5,500,943 A | 3/1996 | Ho et al. |
| 5,504,738 A | 4/1996 | Sambamurthy et al. |
| 5,521,837 A | 5/1996 | Frankle et al. |
| 5,535,223 A | 7/1996 | Horstmann et al. |
| 5,537,601 A | 7/1996 | Kimura et al. |
| 5,543,640 A | 8/1996 | Sutherland et al. |
| 5,550,782 A | 8/1996 | Cliff et al. |
| 5,552,722 A | 9/1996 | Kean |
| 5,572,717 A | 11/1996 | Pedersen |
| 5,574,930 A | 11/1996 | Halverson, Jr. et al. |
| 5,574,942 A | 11/1996 | Colwell et al. |

(Continued)

FOREIGN PATENT DOCUMENTS

| EP | 0315275 A2 | 10/1989 |
|---|---|---|

(Continued)

OTHER PUBLICATIONS

U.S. Appl. No. 09/858,732, filed May 15, 2001, Schultz.

(Continued)

*Primary Examiner*—Leigh M. Garbowski
(74) *Attorney, Agent, or Firm*—W. Eric Webostad

(57) ABSTRACT

Method to determine path timing to and from an embedded device is described. More particularly, clock-to-output delays, interconnects and interconnect logic delays, and setup and hold times for input and output paths from a microprocessor core and a memory controller are obtained and determined, as applicable. These times are assembled in a spreadsheet for associating with respective signals. Times for each of the signals are totaled to determine respective path delays for comparison with a target clock period.

16 Claims, 4 Drawing Sheets

U.S. PATENT DOCUMENTS

| | | | |
|---|---|---|---|
| 5,581,745 A | 12/1996 | Muraoka | |
| 5,600,845 A | 2/1997 | Gilson | |
| 5,610,833 A * | 3/1997 | Chang et al. | 716/11 |
| 5,652,904 A | 7/1997 | Trimberger | |
| 5,671,355 A | 9/1997 | Collins | |
| 5,705,938 A | 1/1998 | Kean | |
| 5,724,557 A * | 3/1998 | McBean, Sr. | 716/6 |
| 5,732,250 A | 3/1998 | Bates et al. | |
| 5,737,631 A | 4/1998 | Trimberger | |
| 5,740,404 A | 4/1998 | Baji | |
| 5,742,179 A | 4/1998 | Sasaki | |
| 5,742,180 A | 4/1998 | DeHon et al. | |
| 5,748,979 A | 5/1998 | Trimberger | |
| 5,752,035 A | 5/1998 | Trimberger | |
| 5,760,607 A | 6/1998 | Leeds et al. | |
| 5,790,435 A * | 8/1998 | Lewis et al. | 716/6 |
| 5,809,517 A | 9/1998 | Shimura | |
| 5,835,405 A | 11/1998 | Tsui et al. | |
| 5,874,834 A | 2/1999 | New | |
| 5,889,788 A | 3/1999 | Pressly et al. | |
| 5,892,961 A | 4/1999 | Trimberger | |
| 5,903,472 A * | 5/1999 | Barrientos | 716/10 |
| 5,910,899 A * | 6/1999 | Barrientos | 716/8 |
| 5,914,616 A | 6/1999 | Young et al. | |
| 5,914,902 A | 6/1999 | Lawrence et al. | |
| 5,933,023 A | 8/1999 | Young | |
| 5,970,254 A | 10/1999 | Cooke et al. | |
| 6,011,407 A | 1/2000 | New | |
| 6,020,755 A | 2/2000 | Andrews et al. | |
| 6,026,481 A | 2/2000 | New et al. | |
| 6,096,091 A | 8/2000 | Hartmann | |
| 6,154,051 A | 11/2000 | Nguyen et al. | |
| 6,163,166 A | 12/2000 | Bielby et al. | |
| 6,167,364 A * | 12/2000 | Stellenberg et al. | 703/19 |
| 6,172,990 B1 | 1/2001 | Deb et al. | |
| 6,178,541 B1 | 1/2001 | Joly et al. | |
| 6,181,163 B1 | 1/2001 | Agrawal et al. | |
| 6,211,697 B1 | 4/2001 | Lien et al. | |
| 6,242,945 B1 | 6/2001 | New | |
| 6,272,451 B1 | 8/2001 | Mason et al. | |
| 6,279,045 B1 | 8/2001 | Muthujumaraswathy et al. | |
| 6,282,627 B1 | 8/2001 | Wong et al. | |
| 6,301,696 B1 | 10/2001 | Lien et al. | |
| 6,343,207 B1 | 1/2002 | Hessel et al. | |
| 6,353,331 B1 | 3/2002 | Shimanek | |
| 6,356,987 B1 | 3/2002 | Aulas | |
| 6,389,558 B1 | 5/2002 | Herrmann et al. | |
| 6,434,735 B1 | 8/2002 | Watkins | |
| 6,453,450 B1 * | 9/2002 | Walter | 716/6 |
| 6,460,172 B1 | 10/2002 | Farre et al. | |
| 6,467,009 B1 | 10/2002 | Winegarden et al. | |
| 6,483,342 B2 | 11/2002 | Britton et al. | |
| 6,507,942 B1 | 1/2003 | Calderone et al. | |
| 6,510,548 B1 | 1/2003 | Squires | |
| 6,518,787 B1 | 2/2003 | Allegrucci et al. | |
| 6,519,753 B1 | 2/2003 | Ang | |
| 6,522,167 B1 | 2/2003 | Ansari et al. | |
| 6,532,572 B1 | 3/2003 | Tetelbaum | |
| 6,539,508 B1 | 3/2003 | Patrie et al. | |
| 6,541,991 B1 | 4/2003 | Hornchek et al. | |
| 6,578,174 B2 | 6/2003 | Zizzo | |
| 6,587,995 B1 | 7/2003 | Duboc et al. | |
| 6,588,006 B1 | 7/2003 | Watkins | |
| 6,601,227 B1 | 7/2003 | Trimberger | |
| 6,604,228 B1 | 8/2003 | Patel et al. | |
| 6,611,905 B1 | 8/2003 | Grundon et al. | |
| 6,611,951 B1 | 8/2003 | Tetelbaum et al. | |
| 6,662,285 B1 | 12/2003 | Douglass et al. | |
| 6,675,272 B2 | 1/2004 | Ware et al. | |
| 6,686,769 B1 | 2/2004 | Nguyen et al. | |
| 6,781,407 B2 | 8/2004 | Schultz | |
| 6,798,239 B2 | 9/2004 | Douglass et al. | |
| 6,871,331 B1 * | 3/2005 | Bloom et al. | 716/4 |
| 6,886,092 B1 | 4/2005 | Douglass et al. | |
| 7,093,240 B1 * | 8/2006 | Rodi et al. | 717/139 |
| 2001/0049812 A1 | 12/2001 | Chan et al. | |
| 2003/0062922 A1 | 4/2003 | Douglas et al. | |
| 2003/0097541 A1 | 5/2003 | Abrosimov et al. | |

FOREIGN PATENT DOCUMENTS

| | | |
|---|---|---|
| EP | 1 235 351 A1 | 8/2002 |
| WO | WO 93 25968 A1 | 12/1993 |
| WO | 0 905 906 A2 | 3/1999 |

OTHER PUBLICATIONS

U.S. Appl. No. 09/861,112, filed May 18, 2001, Dao et al.
U.S. Appl. No. 09/991,410, filed Nov. 16, 2001, Herron et al.
U.S. Appl. No. 09/991,412, filed Nov. 16, 2001, Herron et al.
Sayfe Kiaei et al; "VLSI Design of Dynamically Reconfigurable Array Processor-Drap," IEEE; Feb. 1989; V3.6, IEEE; 3 Park Avenue, 17th Floor, New York, NY 10016-5997; pp. 2484-2488.
Vason P. Srini; "Field Programmable Gate Array (FPGA) Implementation of Digital Sytems: An Alternativce to ASIC"; IEEE; May 1991; IEEE; 3 Park Avenue, 17th Floor, New York, NY 10016-5997; pp. 309-314.
G. Maki et al; "A Reconfigurable Data Path Processor"; IEEE; Aug. 1991; IEEE; 3 Park Avenue, 17th Floor, New York, NY 10016-5997; pp. 18-4.1 to 18-4.4.
Jacob Davidson; "FPGA Implementation of Reconfigurable Microprocessor"; IEEE; Mar. 1993; IEEE; 3 Park Avenue, 17th Floor, New York, NY 10016-5997; pp. 3.21-3.2.4.
Christian Iseli et al.; "Beyond Superscaler Using FPGA's"; IEEE; Apr. 1993;3 Park Avenue, 17th Floor, New York, NY 10016-5997; pp. 486-490.
P.C. French et al.; "A Self-Reconfiguring Processor"; IEEE; Jul. 1993; 3 Park Avenue, 17th Floor, New York, NY 10016-5997; pp. 50-59.
Christian Iseli et al., "SPYDER: A Reconfigurable VLIW Processor Using FPGA's"; IEEE; Jul. 1993; 3 Park Avenue, 17th Floor, New York, NY 10016-5997; pp. 17-24,.
Michael J. Wirthlin et al.; 'The NANO Processor: A Low Resource Reconfigurable Processor; IEEE; Feb. 1994; 3 Park Avenue, 17th Floor, New York, NY 10016-5997; pp. 23-30.
William S. Carter, "The Future of Programmable Logic and Its Impact on Digital System Design"; Apr. 1994; IEEE; 3 Park Avenue, 17th Floor, New York, NY 10016-5997; pp. 10-16.
Andre'DeHon; "DPGA-Coupled Microprocessors: Commodity ICs for the Early 21st Century"; IEEE; Feb. 1994; IEEE; 3 Park Avenue, 17th Floor, New York, NY 10016-5997; pp. 31-39.
Osama T. Alaharna; "Area & Tiem Limitations of FPGA-Based Virtual Hardware"; IEEE; Apr. 1994; 3 Park Avenue, 17th Floor, New York, NY 10016-5997; pp. 184-189.
Xilinx, Inc.; "The Programmable Logic Data Book"; 1994; Revised 1995; available from Xilinx, Inc., 2100 Logic Drive, San Jose, California 95124. no page numbers.
International Business Machines; "Processor Local Bus"; Architecture Specificationws; 32-Bit Implementation; Apr. 2000; First Edition; V2.9; IBM Corporation, Department H83A, P.O. Box 12195, Research Triangle Park, NC 27709; pp. 1-76.
Xilinx, Inc.; Virtex II Platform FPGA Handbook, Dec. 6, 2000, v1.1; available from Xilinx, Inc., 2100 Logic Drive, San Jose, California 95124; pp. 33-75.
Xilinx, Inc.; "The Programmable Logic data Book"; Copyright 2000, Chapter 3; available from Xilinx, Inc., 2100 Logic Drive, San Jose, CA. 95124; pp. 3-1 to 3-1171.
Christian Iseli et al.; "AC++ Compiler for FPGA Custom Execution Units Synthesis"; 1995; IEEE; 3 Park Avenue, 17th Floor, New York, NY 10016-5997; pp. 173-179.
International Business Machines; "PowerPC 405 Embedded Processor Core User Manual," 1996; 5th Ed., International Business Machines; 1580 Rout 52, Bldg. 504, Hopewell Junction, NY 12533-6531; pp. 1-1 to X-16.

Yamin Li et al.; "AIZUP-A Piplined Processor Design and Implementation on Xilinx FPGA Chip"; IEEE; Sep. 1996; IEEE; 3 Park Avenue, 17th Floor, New York, NY 10016-5997; pp. 98-106, 98-106.

Ralph D. Wittig et al.; ONECHIP: An FPGA Processor with Reconfigurable Logic; Apr. 17, 1996; IEEE; 3 Park Avenue, 17th Floor, New York, NY 10016-5997; pp. 126-135.

Xilinx, Inc.; "The Programmable Logic Data Book"; Jan. 27, 1999; Ch. 3, available form Xilinx, Inc., 2100 Logic Drive, San Jose, CA 95124; pp. 3-1 to 3-50.

William B. Andrew et al.; "A Field Programmable System Chip Which Combines FPGA and ASIC Circuitry"; IEEE; May 16, 1999; IEEE; 3 Park Avenue, 17th Floor, New York, NY 10016-5997; pp. 183-186.

Cary D. Snyder et al.; "Xilinx's A-to-Z System Platform"; Cahners Microprocessor; The Insider's Guide to Microporcessor Hardware; Microdesign Resources; Feb. 6, 2001; pp. 1-5.

* cited by examiner

TIMING PERFORMANCE ANALYSIS

FIELD OF THE INVENTION

The present invention relates generally to timing performance analysis, and more particularly to timing performance analysis for an integrated circuit comprising an embedded device.

BACKGROUND OF THE INVENTION

The process for producing an integrated circuit comprises many steps. Conventionally, a logic design is followed by a circuit design, which is followed by a layout design. With respect to the circuit design and layout portion, once circuits for an integrated circuit have been designed, such designs are converted to a physical representation known as a "circuit layout" or "layout." Layout is exceptionally important to developing a working design as it affects many aspects, including, but not limited to, signal noise, signal time delay, resistance, cell area, and parasitic effect.

Once a circuit is designed and laid out, it is often simulated to ensure performance criteria are met, including, but not limited to, signal timing. This type of analysis is difficult at the outset, and is made more difficult by an embedded design. An embedded design or embedded circuit is conventionally designed separately from an integrated circuit in which it is embedded. Sometimes this embedded circuit is referred to an intellectual property (IP) core or embedded core. This is because the information to build and test such an embedded circuit is provided from one company to another.

An IP core may have a certain maximum timing performance for input and output. For example, a microprocessor will have certain maximum timing performance for input and output of data and other information to a memory, or more particularly, a memory controller. In personal computer manufacture, operation of memory, or more particular memory modules, is specified for a bus "speed," such as 33 MHz, 66 MHz, and so on. Presently, the Rambus Signaling Level road map is for a memory to processor bus frequency of 1.2 GHz. However, processors presently operate at speeds in excess of 1.2 GHz, and thus processors must be slowed down for communicating with memory. Moreover, memory is speed graded, and conventionally slower memory costs less than faster memory.

However, there is not de facto standard bus interface for an embedded microprocessor. Accordingly, glue or gasket logic and/or interconnects are used to couple an embedded microprocessor to a host device, such as a programmable logic device. Programmable logic devices exist as a well-known type of integrated circuits that may be programmed by a user to perform specified logic functions. There are different types of programmable logic devices, such as programmable logic arrays (PLAs) and complex programmable logic devices (CPLDs). One type of programmable logic devices, called a field programmable gate array (FPGA), is very popular because of a superior combination of capacity, flexibility and cost.

Accordingly, it would be desirable and useful to provide method and apparatus for timing performance analysis for an embedded device.

SUMMARY OF THE INVENTION

An aspect of the present invention is a method for performing a timing analysis for a core device to be embedded in a host integrated circuit. Clock-to-output timing information is obtained for the core device. Setup and hold timing information and delay timing information is determined for a portion of the host integrated circuit. The clock-to-output timing information, the setup and hold timing information and the delay timing information is associated with respective signals, and a path time delay for each of the respective signals is calculated.

An aspect of the present invention is a method for performing a timing analysis for a core device in a host integrated circuit. Setup and hold timing information is obtained for the core device. Clock-to-output timing information and delay timing information is determined for a portion of the host integrated circuit. The clock-to-output timing information, the setup and hold timing information and the delay timing information is associated with respective signals, and a path time delay for each of the respective signals is calculated.

An aspect of the present invention is a method for determining timing performance. Clock-to-output times for a processor core are obtained. Static timing analysis is used to determine timing data for a memory controller. Setup and hold times are obtained from the timing data for the memory controller. A programmatic representation of logic and interconnects for coupling the memory controller and the processor core is provided. The programmatic representation of logic and interconnects are simulated to obtain delay times. The delay times, the setup and hold times and the clock-to-output times are used as inputs to a spreadsheet, and path times are determined from the spreadsheet.

An aspect of the present invention is a method for determining timing performance. Setup and hold times for a processor core are obtained. Static timing analysis is used to determine timing data for a memory controller. Clock-to-output times are obtained from the timing data for the memory controller. A programmatic representation of logic and interconnects for coupling the memory controller and the processor core is provided. The programmatic representation of logic and interconnects is simulated to obtain delay times. The delay times, the setup and hold times and the clock-to-output times are provided as input to a spreadsheet, and path times are determined from the spreadsheet.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the present invention may admit to other equally effective embodiments.

DETAILED DESCRIPTION OF THE DRAWINGS

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
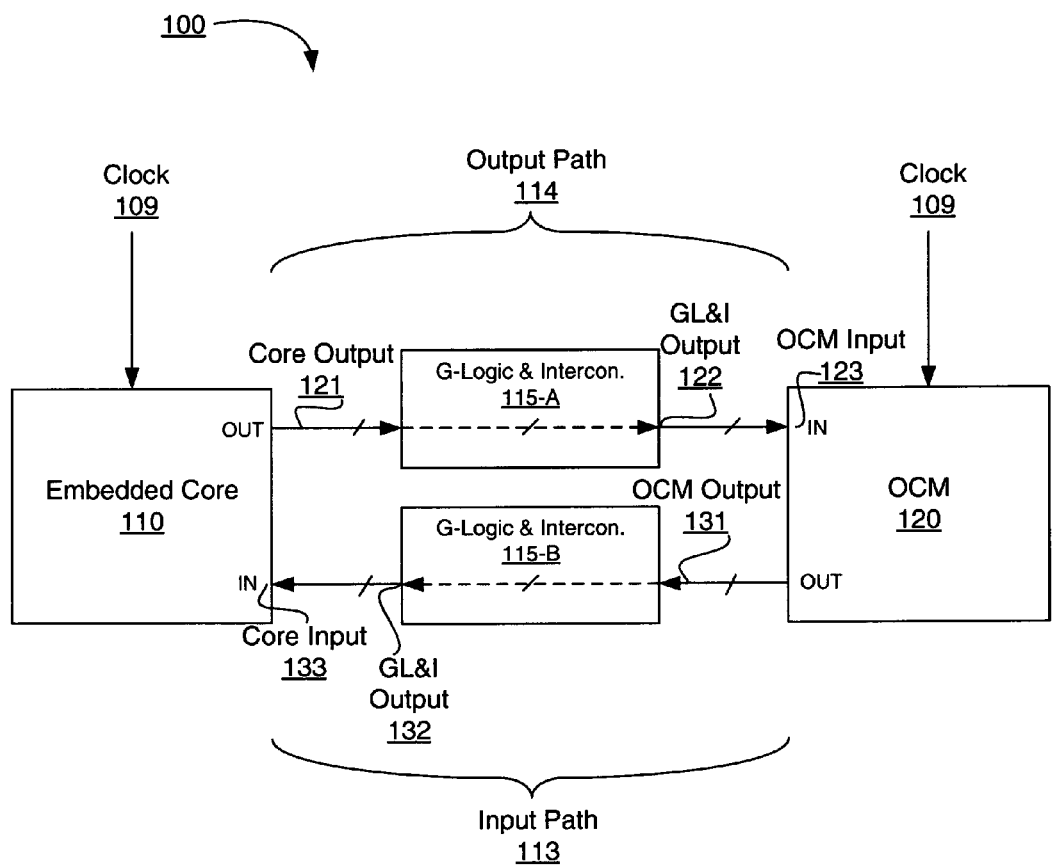
FIG. 1 is a block diagram of an exemplary portion of an embodiment of an integrated circuit in accordance with one or more aspects of the present invention.

Referring to FIG. 1, there is shown a block diagram of an exemplary portion of an embodiment of an integrated circuit 100. Integrated circuit 100 comprises an embedded core 110, such as an embedded microprocessor core, on-chip memory controller 120 (OCM), and gasket or glue logic ("G-logic") and interconnects 115A and 115B. Integrated circuit 100 may be a programmable logic device, such as an FPGA. Accordingly, OCM 120 may be programmed from FPGA circuit fabric, or may be a dedicated memory controller circuit, or a combination thereof. Furthermore, FPGAs conventionally comprise memory and a memory controller, and thus such a memory controller may be used to form at least a portion of OCM 120. Integrated circuit 100 may be formed after a timing analysis in accordance with one or more aspects of the present invention.

There are two signal paths to and from embedded core 110, namely input path 113 and output path 114. Clock signal 109 is provided to embedded core 110 and OCM 120. Each signal path 113, 114 represents provisioning of data, control and address information to and from embedded core 110. Accordingly, each signal path 113, 114 represents more than one signal path. Notably, a maximum time allowed without down grading for speed is:

$$T_{path} = 1/f_{min} \quad (1)$$

where $f_{min}$ represents a minimum acceptable operating frequency for a system. Notably, $f_{min}$ may be set equivalent to a maximum operating frequency for transferring information to and from embedded core 110. Thus, embedded core 110 is used to determine at least an initial value of $f_{min}$. Because there is more than one signal, each signal will have an associated $T_{path}$. However, though each $T_{path}$ delay may be the same for two or more signals it may also be different, depending on routing circuitry and the like. Thus, $T_{path}$ is evaluated for each signal to determine $T_{path}$ for a system. However, as the analysis for each signal is the same, only one input and one output signal is described in the exemplary timing diagram of FIG. 2 for purposes of clarity.

Figure 2:
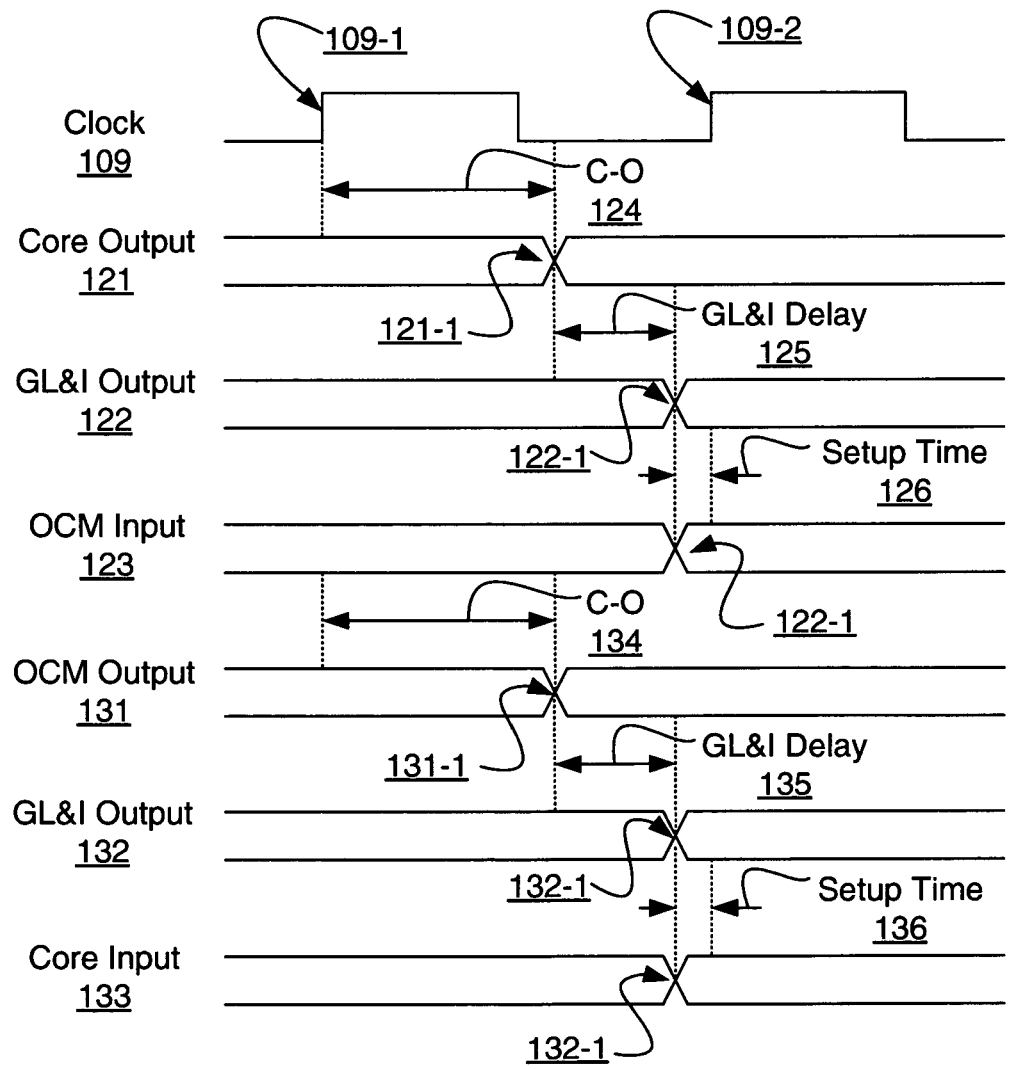
FIG. 2 is a timing diagram for the integrated circuit portion of FIG. 1.

Referring to FIG. 2, there is shown a timing diagram integrated circuit 100 of FIG. 1. With continuing reference to FIG. 2 and renewed reference to FIG. 1, input path 113 comprises delays that go into determining $T_{path}$. OCM output signal 131 has a clock-to-output delay (C-O) 134. This means that from a first triggering edge 109-1 of clock signal 109 to OCM 120, a signal 131 to be outputted from OCM 120 is delayed by an amount of a clock-to-output delay 134 before it is outputted from OCM 120, as indicated by transition 131-1. Another delay in determining is that caused by routing OCM output signal 131 through any G-logic and interconnect 115-B present on input path 113 with respect to communicating such signal. Accordingly, G-logic and interconnect (GL&I) output signal 132 is delayed by GL&I delay 135 with respect to OCM output signal 131, as indicated by transition 132-1. Notably, OCM output signal 131 and an GL&I output signal 132 may be the same signal, in which case transition 131-1 is just transition 132-1 further delayed.

Additionally, embedded core 110 comprises one or more setup and hold times. So, a setup and hold time for an incoming signal to embedded core 110 must be met before a next triggering edge 109-2 of clock signal 109. Embedded core input signal 133 is equivalent to GL&I output signal 132, as indicated by each having transition 132-1. However, embedded core input signal 133 is used in FIG. 2 to clearly delineate setup and hold time (Setup Time) 136 as measured from transition 132-1 of core input signal 133 to triggering edge 109-2 of clock signal 109.

It should be understood that for this embodiment $T_{path}$ is to be less than one period of clock signal 109 to ensure integrated circuit 100 may operate at $f_{min}$ of embedded core 110. In other words, it may be a goal to have clock signal 109 with a frequency of $f_{min}$. This is important because embedded core 110 may be provided as a "hard macro," namely, a fixed layout formed with a set minimum lithographic feature size. In other words, if embedded core 110 may not be changed, then operating at an optimum frequency of embedded core 110 is a set target operating speed. Notably, though the embodiment described herein is a single data rate, the present invention may be used with double data rate timing.

Output path 114 has delays similar to those of input path 113. Accordingly, embedded core 110 provides core output signal 121 delayed by a clock-to-output delay 124 as measured from a triggering edge 109-1 of clock signal 109 to transition 121-1 of output signal 121. Measured from transition 121-1 to transition 122-1 is GL&I delay 125 of GL&I output signal 122 due to G-logic and/or interconnect 115-A. OCM input signal 123 is equivalent to GL&I output signal 122, as indicated by each having transition 122-1. However, OCM input signal 123 is used in FIG. 2 to clearly delineate setup time 126 as measured from transition 122-1 of OCM input signal 123 to triggering edge 109-2 of clock signal 109.

Conventionally, embedded core 110 is provided with performance data including setup and hold times and clock-to-output times. These times may be provided in a known format, such as Standard Delay Format (SDF). Based on the assumption that setup and hold times and clock-to-output times are provided or determined, such as from simulation or testing prior to embedding, for embedded core 110, flow diagrams of FIGS. 3 and 4 are described.

Figure 3:
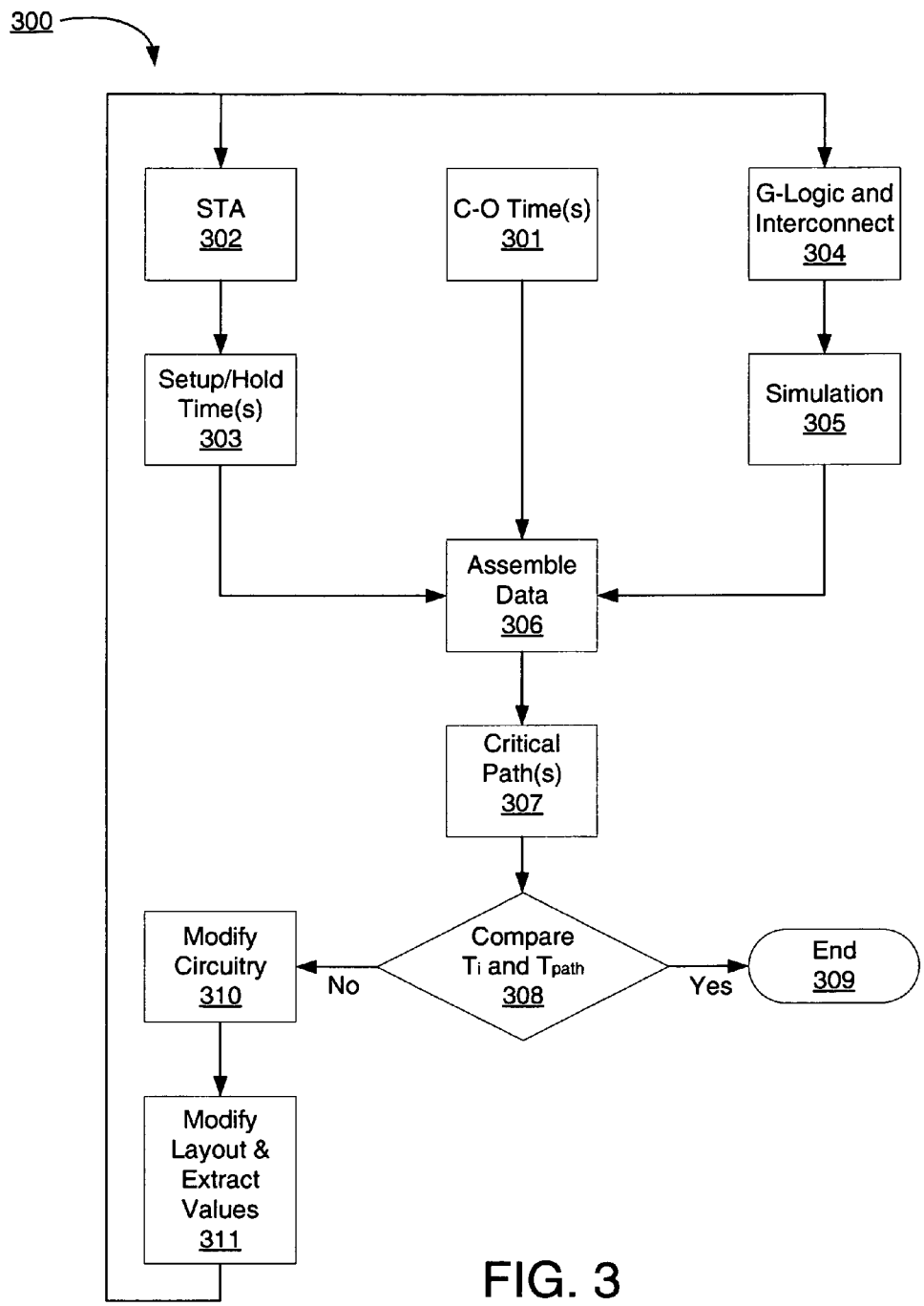
FIGS. 3 and 4 are flow diagrams of respective exemplary embodiment of timing performance analysis processes for output and input paths, respectively, for the integrated circuit of FIG. 1 in accordance with one or more aspects of the present invention.
Figure 4:
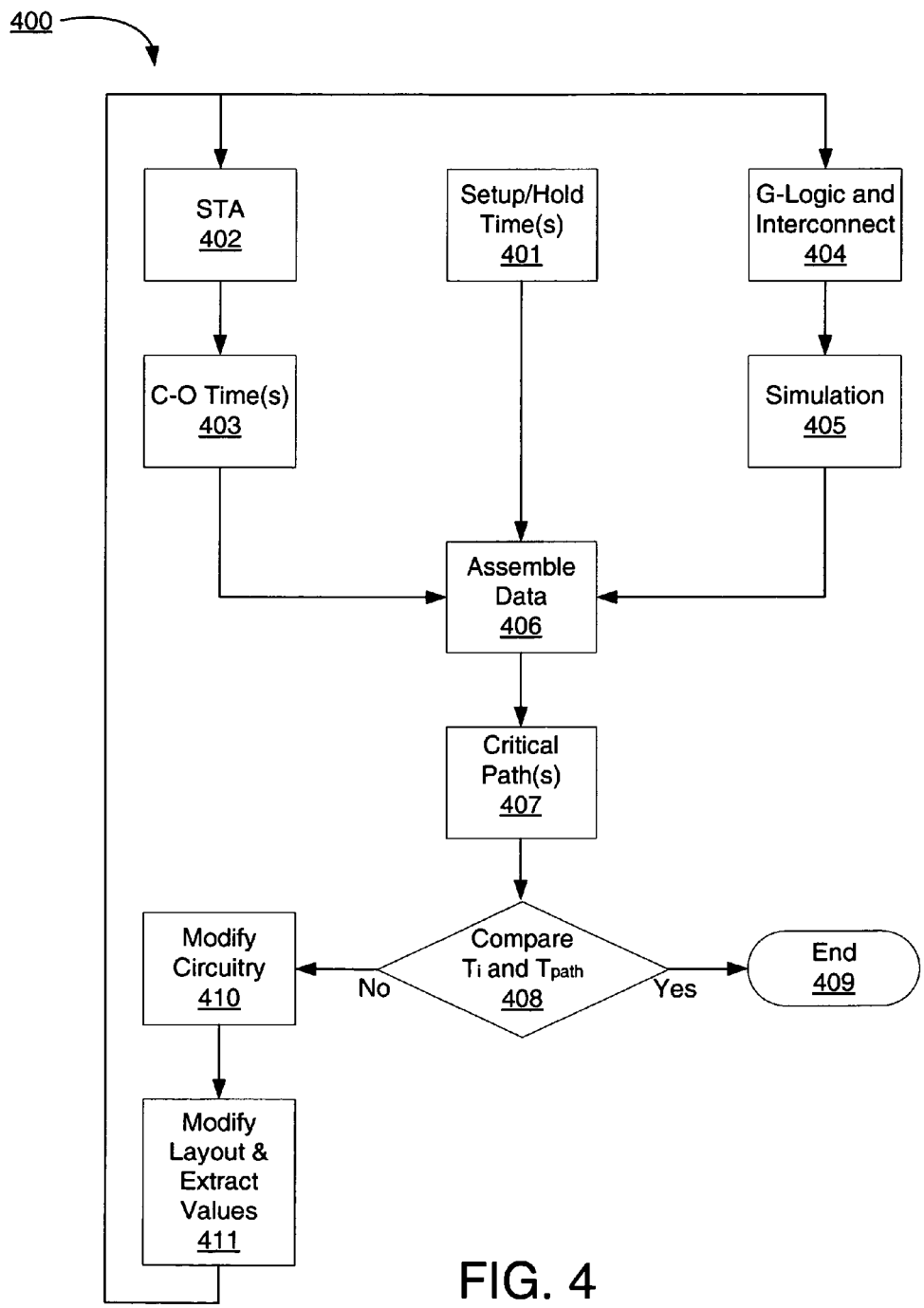

Referring to FIG. 3, there is shown a flow diagram of an exemplary embodiment of a timing performance analysis process 300 in accordance with one or more aspects of the present invention. With continuing reference to FIG. 4 and renewed reference to FIG. 1, timing performance analysis process 300 is described. Timing performance analysis process 300 is for output path 114.

At step 301, clock-to-output times are obtained for embedded core 110. At step 302, a static timing analysis is done on OCM 120. This static timing analysis is done by simulation at a transistor-level, and may be done with a product called PathMill from Synopsis of Mountain View, Calif. At step 303, data from step 302 is used to determine respective setup and hold times for signals to be inputted to OCM 120.

At step 304, a programmatic representation of gasket logic and interconnects 115-A is provided. Such a representation may be done in Verilog or VHDL, for example. At step 305, this programmatic representation is taken down from a logic level to something closer to a physical or transistor level, as such with HSpice or like program simulation, and simulated to get delays associated with signals passing through gasket logic and interconnects 115-A.

At step 306, outputs from steps 303 and 305, namely, setup and hold times for OCM 120 and signal delays for gasket logic and interconnects 115-A, respectively, are associated with clock-to-output times for embedded core 110 from step 301. This association may be done using a spreadsheet, a database and the like. For example, assuming data_out_1 from embedded core 110 is under consideration, then a spreadsheet association may look something like that shown in Table I,

TABLE I

| Signal | C-O | GL&I Delay | Setup/Hold | Total Time |
|---|---|---|---|---|
| DO1 | 100 | 50 | 25 | 175 | where all values are expressed in units of time, such as picoseconds for example.

At step 307, critical paths are identified by totaling C-O delay, GL&I delay and Setup/Hold time to provide a total time for each signal traveling along output path 114. Accordingly, a total time, $T_i$, is determined for each signal on output path 114 going from embedded core 110 to OCM 120.

At step 308, $T_i$ is compared to $T_{path}$. For example, it may be determined whether $T_{path}$ is greater than or equal to $T_i$ for each signal. Notably, it should be appreciated that if $T_i$ was equal to $T_{path}$, then there would be "critical" timing. Accordingly, at step 308, such a check may be for $T_{path}$ greater than $T_i$ to avoid critical timing. Moreover, to ensure a margin of error, $T'_{path}$, which is approximately 1 to 10 percent, for example, less than $T_{path}$, may be used at step 308 for comparison with $T_i$. For purposes of clarity, the remainder of FIG. 3 is described as though $T_i$ must be less than or equal to $T_{path}$, though it should be understood that other comparisons may be used.

Alternatively, timing performance analysis process 300 may end at step 307. This is because a largest value of times $T_i$ may be determined, and frequency of operation of output path 114 of embedded core 110 may be set from there.

However, assuming either or both OCM 120 and gasket logic and interconnects 115-A may be modified, if any $T_i$ is greater than $T_{path}$, then at step 310 circuitry from either or both OCM 120 and gasket logic and interconnects 115-A is modified to reduce time associated with identified critical paths, namely, signal paths producing $T_i$'s greater than $T_{path}$. In response to modification of circuitry at step 310, layout for such modified circuitry is made at step 311 and circuitry values associated therewith including, but not limited to, resistance, capacitance, among others both actual and parasitic, are extracted. Modified circuitry and associated circuitry values are fed back at steps 302 and 304, as applicable. For example, if no change results in OCM 120 to modification to gasket logic and interconnect 115-A, then there is nothing to feedback, and vise versa with respect to change to OCM 120 resulting in no change to gasket logic and interconnect 115-A. Of course, modification may be made to both OCM 120 and gasket logic and interconnect 115-A resulting in feedback for both.

Timing performance analysis process 300 may continue, until at step 308 each $T_i$ is less than or equal to $T_{path}$, in which event timing performance analysis process 300 ends at step 309. Notably, timing performance analysis process 300 works with embedded core 110 formed with a lithography of a first minimum dimension and OCM 120/gasket logic and interconnects 115-A form with a lithography of a second minimum dimension different than the first minimum dimension. So, for example, embedded core 110 may be formed using 0.13 micron lithography and OCM 120/gasket logic and interconnects 115-A may be formed using 0.18 micron lithography.

Referring to FIG. 4, there is shown a flow diagram of an exemplary embodiment of a timing performance analysis process 400 in accordance with one or more aspects of the present invention. With continuing reference to FIG. 4 and renewed reference to FIG. 1, timing performance analysis process 400 is described. Timing performance analysis process 400 is for input path 113.

At step 401, setup and hold times are obtained for embedded core 110. At step 402, a static timing analysis is done on OCM 120. This static timing analysis is done by simulation at a transistor-level, and may be done with a product called PathMill from Synopsis of Mountain View, Calif. At step 403, data from step 402 is used to determine respective clock-to-output times for signals to be outputted from OCM 120.

At step 404, a programmatic representation of gasket logic and interconnects 115-B is provided. Such a representation may be done in Verilog or VHDL, for example. At step 405, this programmatic representation is taken down from a logic level to something closer to a physical or transistor level, as such with HSpice or like program simulation, and simulated to get delays associated with signals passing through gasket logic and interconnects 115-B.

At step 406, outputs from steps 403 and 405, namely, clock-to-output times for OCM 120 and signal delays for gasket logic and interconnects 115-B, respectively, are associated with setup and hold times for embedded core 110 from step 401. This association may be done using a spreadsheet, a database and the like. For example, assuming data_in_1 to embedded core 110 is under consideration, then a spreadsheet association may look something like that shown in Table II,

TABLE II

| Signal | C-O | GL&I Delay | Setup/Hold | Total Time |
|---|---|---|---|---|
| DI1 | 150 | 50 | 25 | 225 | where all values are expressed in units of time, such as picoseconds for example.

At step 407, critical paths are identified by totaling C-O delay, GL&I delay and Setup/Hold time to provide a total time for each signal traveling along input path 113. Accordingly, a total time, $T_i$, is determined for each signal on input path 113 going from OCM 120 to embedded core 110.

At step 408, $T_i$ is compared to $T_{path}$. For example, it may be determined whether $T_{path}$ is greater than or equal to $T_i$ for each signal. Notably, it should be appreciated that if $T_i$ was equal to $T_{path}$ then there would be "critical" timing. Accordingly, at step 408, such a check may be for $T_{path}$ greater than $T_i$ to avoid critical timing. Moreover, to ensure a margin of error, $T_{path}$, which is approximately 1 to 10 percent, for example, less than $T_{path}$, may be used at step 408 for comparison with $T_i$. For purposes of clarity, the remainder of FIG. 4 is described as though $T_i$ must be less than or equal to $T_{path}$, though it should be understood that other comparisons may be used.

Alternatively, timing performance analysis process 400 may end at step 407. This is because a largest value of times $T_i$ may be determined, and frequency of operation of input path 113 of embedded core 110 may be set from there.

However, assuming either or both OCM 120 and gasket logic and interconnects 115-B may be modified, if any $T_i$ is greater than $T_{path}$, then at step 410 circuitry from either or both OCM 120 and gasket logic and interconnects 115-B is modified to reduce time associated with identified critical paths, namely, signal paths producing $T_i$'s greater than $T_{path}$. In response to modification of circuitry at step 410, layout for such modified circuitry is made at step 411 and circuitry values associated therewith including, but not limited to, resistance, capacitance, and inductance, among others both actual and parasitic, are extracted. Modified circuitry and associated circuitry values are fed back at steps 402 and 404, as applicable. For example, if no change results in OCM 120 to modification to gasket logic and interconnect 115-B, then there is nothing to feedback, and vise versa with respect to change to OCM 120 resulting in no change to gasket logic and interconnect 115-B. Of course, modification may be made to both OCM 120 and gasket logic and interconnect 115-B resulting in feedback for both.

Timing performance analysis process 400 may continue, until at step 408 each $T_i$ is less than or equal to $T_{path}$, in which event timing performance analysis process 400 ends at step 409. Notably, timing performance analysis process 400 works with embedded core 110 formed with a lithography of a first minimum dimension and OCM 120/gasket logic and interconnects 115-B form with a lithography of a second minimum dimension different than the first minimum dimension. So, for example, embedded core 110 may be formed using 0.13 micron lithography and OCM 120/gasket logic and interconnects 115-B may be formed using 0.18 micron lithography.

While foregoing is directed to the preferred embodiment of the present invention, other and further embodiments of the invention may be devised without departing from the basic scope thereof, and the scope thereof is determined by the claims that follow. For example, though the present invention is described in terms of an FPGA and embedded processor core, it should be understood that constructs other than an FPGA and an embedded processor core may be used, including, but not limited to, combinations formed of a programmable logic device and at least one of a memory, an Application Specific Integrated Circuit, an Application Specific Standard Product, a Digital Signal Processor, a microprocessor, a microcontroller, and the like.

All trademarks are the respective property of their owners.

The invention claimed is:

1. A method for determining timing performance, comprising:
    obtaining clock-to-output times for a processor core;
    using static timing analysis to determine timing data for a memory controller;
    obtaining setup and hold times from the timing data for the memory controller;
    providing a programmatic representation of logic and interconnects for coupling the memory controller and the processor core;
    simulating the programmatic representation of logic and interconnects to obtain delay times;
    inputting the delay times, the setup and hold times and the clock-to-output times to a spreadsheet; and
    determining path times from the spreadsheet.

2. The method of claim 1 further comprising comparing timing of at least one of the path times to a clock period.

3. The method of claim 2 wherein the clock-to-output times are expressed in a Standard Delay Format.

4. The method of claim 1 wherein the step of inputting comprises associating a delay time of the delay times, a setup and hold time of the setup and hold times, and a clock-to-output time of the clock-to-output times to an output signal from the processor core.

5. The method of claim 4 wherein the delay time, the setup and hold time and the clock-to-output time are totaled in the step of determining to provide a path time.

6. The method of claim 5 further comprising comparing the path time to a clock period.

7. The method of claim 6 wherein the memory controller and the processor core are to be part of a programmable logic device, wherein the processor core is to be embedded in the programmable logic device.

8. The method of claim 7 wherein the memory controller and the processor core are laid out according to different lithographic minimum dimensions.

9. A method for determining timing performance, comprising:
    obtaining setup and hold times for a processor core;
    using static timing analysis to determine timing data for a memory controller;
    obtaining clock-to-output times from the timing data for the memory controller;
    providing a programmatic representation of logic and interconnects for coupling the memory controller and the processor core;
    simulating the programmatic representation of logic and interconnects to obtain delay times;
    inputting the delay times, the setup and hold times and the clock-to-output times to a spreadsheet; and
    determining path times from the spreadsheet.

10. The method of claim 9 further comprising comparing timing of at least one of the path times to a clock period.

11. The method of claim 10 wherein the clock-to-output times are expressed in a Standard Delay Format.

12. The method of claim 9 wherein the step of inputting comprises associating a delay time of the delay times, a setup and hold time of the setup and hold times, and a clock-to-output time of the clock-to-output times to an output signal from the processor core.

13. The method of claim 12 wherein the delay time, the setup and hold time and the clock-to-output time are totaled in the step of determining to provide a path time.

14. The method of claim 13 further comprising comparing the path time to a clock period.

15. The method of claim 14 wherein the memory controller and the processor core are to be part of a programmable logic device, wherein the processor core is to be embedded in the programmable logic device.

16. The method of claim 15 wherein the memory controller and the processor core are laid out according to different lithographic minimum dimensions.

* * * * *